(12) United States Patent
Kang et al.

(10) Patent No.: US 10,109,731 B2
(45) Date of Patent: Oct. 23, 2018

(54) POWER MOSFET AND METHOD FOR MANUFACTURING THE SAME

(71) Applicants: Magnachip Semiconductor, Ltd., Cheongju-si (KR); ITM Semiconductor Co., Ltd., Cheongju-si (KR)

(72) Inventors: Soo Chang Kang, Seoul (KR); Seung Hyun Kim, Seoul (KR); Yong Won Lee, Bucheon-si (KR); Ho Seok Hwang, Gunpo-si (KR); Sang Hoon Ahn, Cheongju-si (KR)

(73) Assignees: Magnachip Semiconductor, Ltd., Cheongju-si (KR); ITM Semiconductor Co., Ltd., Cheongju-si (KR)

( * ) Notice: Subject to any disclaimer, the term of this patent is extended or adjusted under 35 U.S.C. 154(b) by 21 days.

(21) Appl. No.: 15/334,906

(22) Filed: Oct. 26, 2016

(65) Prior Publication Data

US 2017/0125576 A1    May 4, 2017

(30) Foreign Application Priority Data

Oct. 30, 2015 (KR) .................. 10-2015-0152213

(51) Int. Cl.
*H01L 29/78* (2006.01)
*H01L 29/66* (2006.01)
(Continued)

(52) U.S. Cl.
CPC ...... *H01L 29/7804* (2013.01); *H01L 27/0255* (2013.01); *H01L 27/0266* (2013.01); *H01L 29/1037* (2013.01); *H01L 29/1095* (2013.01); *H01L 29/41741* (2013.01); *H01L 29/4236* (2013.01); *H01L 29/66666* (2013.01); *H01L 29/66734* (2013.01); *H01L 29/66787* (2013.01); *H01L 29/7813* (2013.01); *H01L 29/7827* (2013.01)

(58) Field of Classification Search
CPC ............ H01L 27/0716; H01L 27/0727; H01L 29/1037; H01L 29/41741; H01L 29/4236; H01L 29/66666; H01L 29/66734; H01L 29/66787; H01L 29/7804; H01L 29/7813; H01L 29/7827
See application file for complete search history.

(56) References Cited

U.S. PATENT DOCUMENTS

2006/0071268 A1    4/2006  Tai et al.
2008/0048255 A1    2/2008  Ishida et al.
(Continued)

FOREIGN PATENT DOCUMENTS

JP      5-304297 A       11/1993
KR   10-0689318 B1        3/2007

*Primary Examiner* — Stephen W Smoot
(74) *Attorney, Agent, or Firm* — NSIP Law

(57) ABSTRACT

A power MOSFET includes an insulating layer, a first conductivity type doping layer situated on a bottom of the insulating layer, a second conductivity type body situated on a bottom of the first conductivity type doping layer, a gate electrode adjacent to the bottom of the insulating layer and covered with an insulating film in other regions and projected to penetrate the second conductivity type body, and a source electrode including a first region situated on a top of the insulating layer and a second region in contact with the first conductivity type doping layer by penetrating the insulating layer.

25 Claims, 9 Drawing Sheets

(51) Int. Cl.
*H01L 29/423* (2006.01)
*H01L 29/417* (2006.01)
*H01L 29/10* (2006.01)
*H01L 27/02* (2006.01)

(56) References Cited

U.S. PATENT DOCUMENTS

2013/0234241 A1\* 9/2013 Bowers ................ H01L 29/407
 257/330
2014/0084360 A1\* 3/2014 Patti ..................... H01L 29/861
 257/328

\* cited by examiner

POWER MOSFET AND METHOD FOR MANUFACTURING THE SAME

CROSS-REFERENCE TO RELATED APPLICATIONS

This application claims the benefit under 35 USC 119(a) of priority of Korean Patent Application No. 10-2015-0152213 filed on Oct. 30, 2015, the entire disclosure of which is incorporated by reference for all purposes.

BACKGROUND

1. Field

The following description relates to a power MOSFET. The following description also relates to a power MOSFET that constitutes a bidirectional diode configured to control a flow of current through the bidirectional diode and a method for manufacturing such a power MOSFET.

2. Discussion of Related Art

A power MOSFET may be used in a battery protection circuit including at least one serial and/or parallel cell. In the power MOSFET, a high-concentration N+ substrate is used as a drain electrode. As a result, a lower part of a substrate may become a drain electrode and the drain electrode may be commonly connected in a wafer. Such a battery protection circuit requires that the power MOSFET has high electron mobility at a predetermined size in order to increase efficiency of a battery pack and more efficiently use a space. In related art, the battery protection circuit primarily adopts a positive temperature coefficient of resistor (PTC), but precision of the PTC is low and a product defect of the PTC easily occurs and accordingly the cost of the PTC is high. As a result, the PTC approach in the battery protection circuit has been substituted for with the power MOSFET in recent years.

The battery protection circuit in the related art includes two power MOSFETs and integrated circuits and the respective power MOSFETs are controlled through the integrated circuits according to a charge or a discharge direction of a battery. However, in such a battery protection circuit, when two power MOSFETs are used, ON resistance $R_{ON}$ is high and an area of the circuit increases as well, and as a result, cost increases.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power MOSFET includes an insulating layer, a first conductivity type doping layer situated on a bottom of the insulating layer, a second conductivity type body situated on a bottom of the first conductivity type doping layer, a gate electrode adjacent to the bottom of the insulating layer and covered with an insulating film in other regions and projected to penetrate the second conductivity type body, and a source electrode including a first region situated on a top of the insulating layer and a second region in contact with the first conductivity type doping layer by penetrating the insulating layer.

The power MOSFET may further include a bias electrode situated to be spaced apart from the source electrode and to contact the second conductivity type body by penetrating the insulating layer.

The power MOSFET may further include a first conductivity type epitaxial layer situated on a bottom of the second conductivity type body and inserted into by the gate electrode.

The power MOSFET may further include a first conductivity type substrate, wherein the first conductivity type epitaxial layer is formed of the same crystalline material as the first conductivity substrate.

The second conductivity type body may be connected with the first conductivity type epitaxial layer and the first conductivity type doping layer, situated to be spaced apart from each other to form a bidirectional diode region.

The bidirectional diode region may be a PN junction diode.

The bias electrode may apply bias voltage to the second conductivity type body to generate a flow of current toward the first conductivity type epitaxial layer or the first conductivity type doping layer.

The first conductivity type doping layer may be formed by omitting an etching process for a region of the first conductivity type doping layer, which faces the source electrode so as to form the first conductivity type doping layer with a depth between the second conductivity type body and the source electrode.

The first conductivity type doping layer may be formed by an etching process for a part of the region of the first conductivity type doping layer, which faces the source electrode so as to form a depth between the second conductivity type body and the source electrode.

The first conductivity type doping layer may formed with a depth being 0.3 to 0.5 μm and may prevent the source electrode and the second conductivity type body from contacting each other.

The first conductivity type doping layer may be formed with a threshold voltage of at least 12 V and may prevent the source electrode and the second conductivity type body from contacting each other.

The insulating layer may insulate the source electrode and the gate electrode from each other and a region of the insulating layer used for contacting the source electrode and the first conductivity type doping layer may be etched.

In another general aspect, a method for manufacturing a power MOSFET includes forming a first conductivity type doping layer doped with first conductivity type impurities at a depth on a top of a second conductivity type body situated on a top of a first conductivity type epitaxial layer, forming a gate electrode penetrating the first conductivity type doping layer and the second conductivity type body, forming an insulating layer on a top of the first conductivity type doping layer, etching the insulating layer so that the first conductivity type doping layer maintains the depth, and forming a source electrode at a partial region of the etched insulating layer.

The depth may correspond to a sufficient depth to prevent the second conductivity type body and the source electrode from contacting each other.

The etching of the insulating layer may include etching the insulating layer to prevent the second conductivity type body and the source electrode from contacting each other.

The etching of the insulating layer may include etching the insulating layer so that the first doping layer is formed with the depth being 0.3 to 0.5 μm.

The forming of the first conductivity type doping layer may include doping the first conductivity type impurities so that the first conductivity type doping layer is formed with a threshold voltage of at least 12 V.

The method may further include forming a bias electrode at a partial area of the etched insulating layer, where the source electrode is not formed.

The forming of the bias electrode may include applying a bias voltage to the second conductivity type body to generate a flow of current toward the first conductivity type epitaxial layer or the first conductivity type doping layer.

In another general aspect, a method for manufacturing a power MOSFET includes forming gate electrodes spaced apart from each other on a top of a first conductivity type epitaxial layer, forming a second conductivity type body surrounding the gate electrodes spaced apart from each other on the top of the first conductivity type epitaxial layer, forming a first conductivity type doping layer doped with first conductivity type impurities at a depth on a top of the second conductivity type body, forming an insulating layer on a top of the first conductivity type doping layer, etching the insulating layer so that the first conductivity type doping layer maintains the depth, and forming a source electrode at a partial region of the etched insulating layer.

The etching of the insulating layer may include etching the insulating layer to prevent the second conductivity type body and the source electrode from contacting each other.

The etching of the insulating layer may include etching the insulating layer so that the first doping layer is formed with the depth being 0.3 to 0.5 μm.

The forming of the first conductivity type doping layer may include doping the first conductivity type impurities so that the first conductivity type doping layer forms threshold voltage of at least 12 V.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
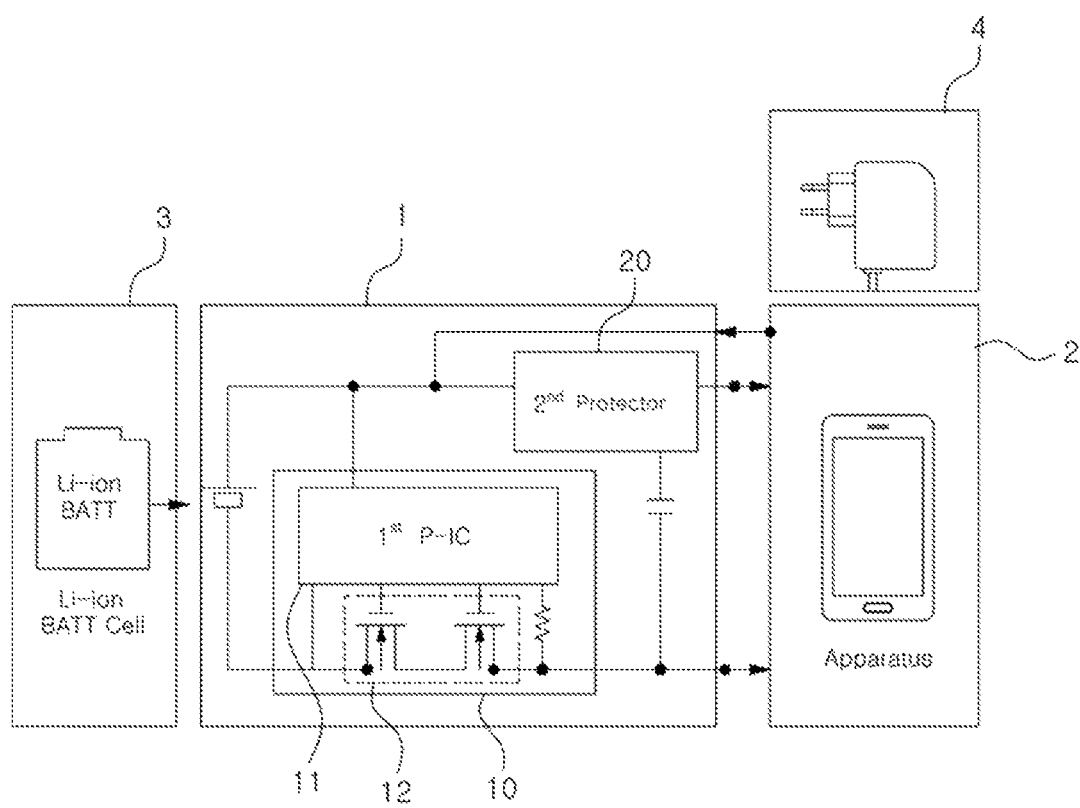
FIG. 1 is a block diagram of a battery protection circuit according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

An object of the examples is to provide a power MOSFET that controls a flow of current through a bidirectional diode.

Another object of the examples is to provide a power MOSFET that forms a first conductivity type doping layer between a source electrode and a second conductivity type body to prevent the source electrode from contacting the body.

Yet another object of the examples is to provide a power MOSFET that omits an etching process of an area where a first conductivity type doping layer faces the source electrode. As a result, the first doping layer forms a predetermined depth between a second conductivity type body and the source electrode.

A disclosed technology may provide the following effects. However, since it is not meant that a specific example includes all of the following effects or only the following effects, it is not to be appreciated that the scope of the disclosed technology is limited to the following effects.

Figure 2:
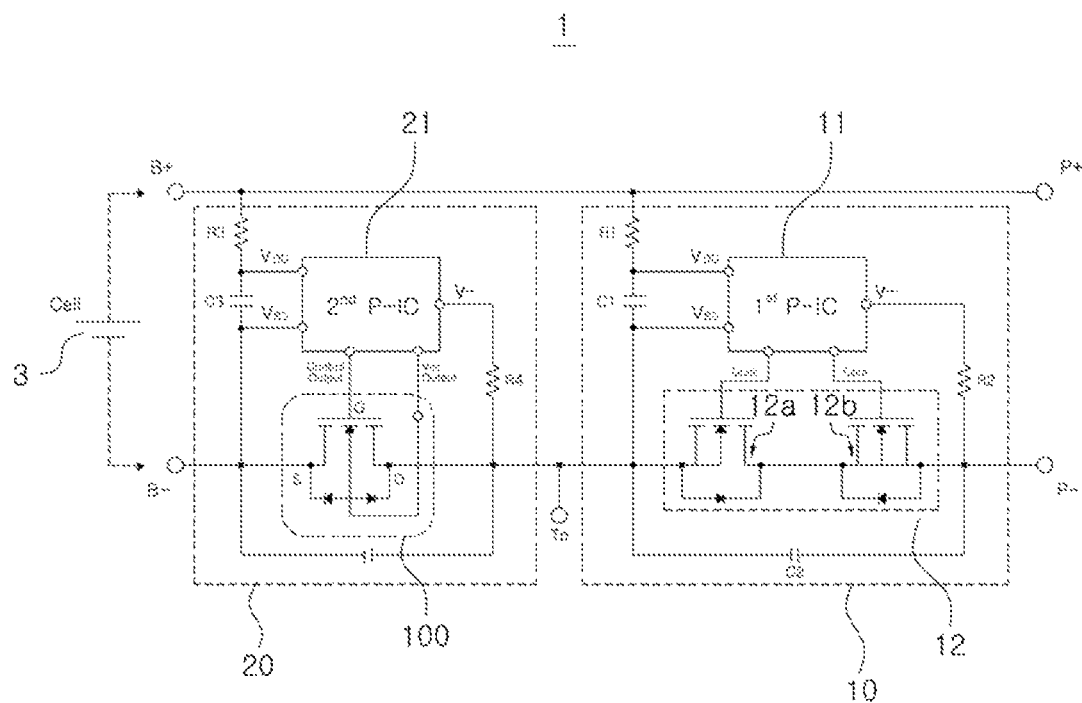
FIG. 2 is a circuit diagram illustrating the battery protection circuit illustrated in the example of FIG. 1.

FIG. 1 is a block diagram of a battery protection circuit according to an example and FIG. 2 is a circuit diagram illustrating the battery protection circuit illustrated in the example of FIG. 1.

Referring to the examples of FIGS. 1 and 2, the battery protection circuit 1 includes a first protector 10 and a second protector 20.

For example, the battery protection circuit 1 protects a battery 3 while charging and discharging the battery embedded in an electronic apparatus 2. In further detail, the battery protection circuit 1 protects the battery 3 that includes a plurality of serial and/or parallel cells. In the example of FIG. 1, the battery protection circuit 1 prevents overcurrent from flowing on the battery 3. Thus, to perform this objective, the battery protection circuit 1 may break current flow in charge or discharge directions of the battery.

In the example of FIG. 1, the electronic apparatus 2 is connected with external power through an adapter 4. In such an example, the adapter 4 is used to resolve an electrical imbalance between the external power source and the battery 3. The adapter 4 receives the external power and converts the received external power into a level suitable for charging the battery 3.

In this example, the battery protection circuit 1 performs a duplicated protection process of the battery 3 through using the first and second protectors 10 and 20. The first protector 10 performs the primary protection process of the battery 3 and the second protector 20 performs the second protection process of the battery 3. That is, the second protector 20 may complementally and additionally perform the protection process of the battery 3, as an adjunct to the first protector 10. The battery protection circuit 1 stably protects the battery 3 while charging and discharging the battery 3 through such a duplicated protection process.

In the example of FIG. 1, the first protector 10 includes a first protection integrated circuit 11 and a plurality of protection elements 12. In an example, the plurality of protection elements 12 are implemented as dual MOSFETs. Thus, the first protection integrated circuit 11 drives different protection elements 12a and 12b according to the charging or discharging of the battery 3. For example, when the battery 3 is charged, the first protection integrated circuit 11 breaks the flow of the overcurrent by using the second protection element 12b. However, when the battery 3 is discharged, the first protection integrated circuit 11 breaks the flow of the overcurrent by using the first protection element 12a. That is, the plurality of protection elements 12 are not used simultaneously and the respective protection elements 12 are used appropriate according to whether the battery 3 is in a charging or a discharging situation.

The plurality of respective protection elements 12 in the related art may be body-contacted to a source electrode in order to implement a one-way diode, alternatively referred to as a unidirectional diode. For example, each of the plurality of respective protection elements 12 may be designed to include the unidirectional diode facing the same direction. Accordingly, when the first protection element 12a includes the unidirectional diode as facing a drain terminal, the second protection element 12b may also include the unidirectional diode as facing the drain terminal. That is, each of the plurality of respective protection elements 12 is driven by the first protection integrated circuit 11 according to the charging or discharging direction of the battery 3.

In the example of FIG. 1, the second protector 20 includes a second protection integrated circuit 21 and a power MOSFET 100. In such an example, the power MOSFET 100 is implemented as a single MOSFET and corresponds to the protection element of the battery 3. The second protection integrated circuit 21 drives the power MOSFET 100 according to the charging or discharging direction of the battery 3. For example, the power MOSFET 100 includes a bidirectional diode so as to control current that flows bidirectionally. For example, when the battery 3 is charged, the second protection integrated circuit 21 drives the bidirectional diode of the power MOSFET 100 unidirectionally and when the battery 3 is discharged, the second protection integrated circuit 21 drives the bidirectional diode of the power MOSFET 100 unidirectionally in another direction. That is, the power MOSFET 100 is implemented through one MOSFET including the bidirectional diode and is accordingly implemented at a lower cost than another approach using the plurality of protection elements, such as, alternatively, the dual MOSFETs 12 in the related art.

The second protection integrated circuit 21 controls a bias voltage applied to the power MOSFET 100 to control the bidirectional diode of the power MOSFET 100. That is, the second protection integrated circuit 21 controls the bidirectional diode of the power MOSFET 100 to break the flow of the overcurrent with respect to both the charging and discharging directions. Subsequently, a structure and an operation of the power MOSFET 100 is described in detail in FIGS. 3 to 8.

The power MOSFET 100 may perform the same function under a further improved condition than the plurality of protection elements 12. In greater detail, the power MOSFET 100 may have a lower ON resistance $R_{ON}$ and also be implemented as having a smaller area than the plurality of protection elements 12. Accordingly, the battery protection circuit 1 reduces a chip area of the second protector 20 by using the power MOSFET 100 to save cost and improve precision when producing the battery protection circuit 1.

Figure 3:
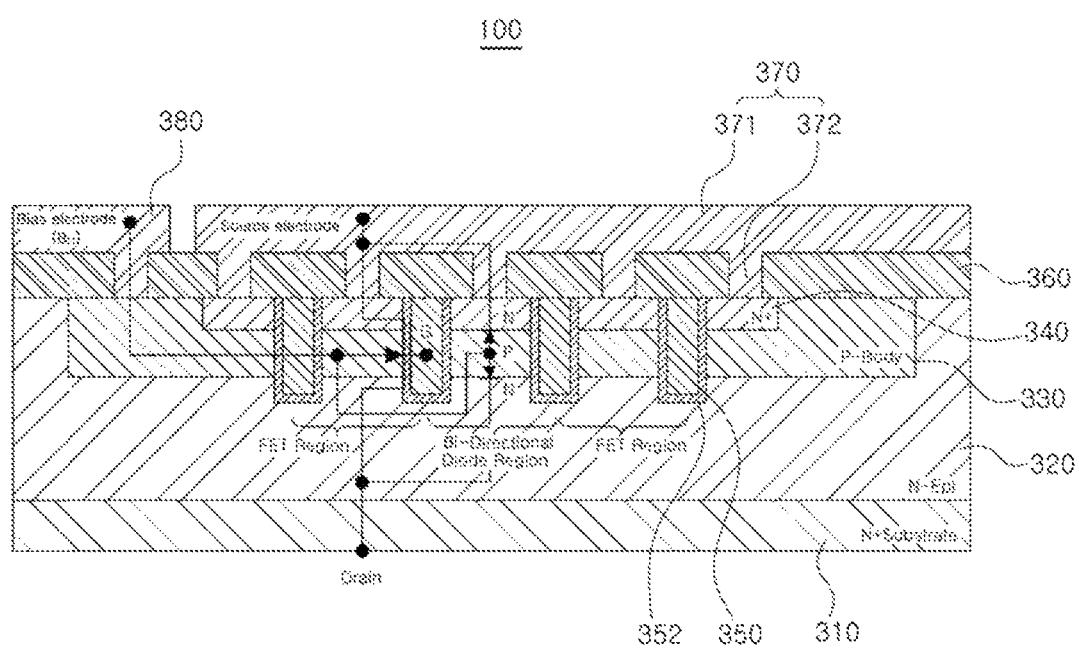
FIG. 3 is a diagram describing a power MOSFET of the battery protection circuit in the example of FIG. 2.

FIG. 3 is a diagram describing a power MOSFET of the battery protection circuit in the example of FIG. 2.

Referring to the example of FIG. 3, the power MOSFET 100 includes a first conductivity type substrate 310, a first conductivity type epitaxial layer 320, a second conductivity type body 330, a first conductivity type doping layer 340, a gate electrode 350, an insulating layer 360, a source electrode 370, and a bias electrode 380.

In the example of FIG. 3, the power MOSFET 100 is not necessarily limited to such an example, but a first conductivity type may be implemented as an N type and a second conductivity type may be implemented as a P type. FIG. 3 is merely used for describing a particular example and is not used for limiting the scope of the examples.

For example, the first conductivity type substrate 310 corresponds to a base of the power MOSFET 100. In an example, the first conductivity type substrate 310 is implemented as an N type substrate. The first conductivity type substrate 310 may include high-concentration ions and may be used as the drain electrode. That is, the first conductivity type substrate 310 is situated at a lowermost part of the power MOSFET 100 to operate as the drain. The drain electrode may be commonly connected in a wafer.

In the example of FIG. 3, the first conductivity type epitaxial layer 320 is situated on the top of the first conductivity type substrate 310. The first conductivity type epitaxial layer 320 is situated on the bottom of the second conductivity type body 330 and the gate electrode 350 is inserted into the first conductivity type epitaxial layer 320. In an example, the first conductivity type epitaxial layer 320 is grown on the top of the first conductivity type substrate 310 and is implemented as an N− epitaxial layer. For example, the first conductivity type epitaxial layer 320 may be formed of the same crystalline material as the first conductivity type substrate 310.

In this example, the second conductivity type body 330 is formed on the top of the first conductivity type epitaxial layer 320 with a predetermined depth. In such an example, the second conductivity type body 330 is formed at a partial area of the top of the first conductivity type epitaxial layer 320 and implemented as a P type body. Additionally, forward bias or reverse bias is applied to the second conductivity type body 330. The second conductivity type body 330 is connected with the bias electrode 380 to receive bias voltage $B_{IN}$ from the bias electrode 380. Herein, the second conductivity type body 330 corresponds to a channel region or a depletion region and provides a path on which current flows. That is, the second conductivity type body 330 receives the bias voltage $B_{IN}$ to form a channel and the current flows through the formed channel.

The second conductivity type body 330 is connected with the first conductivity type epitaxial layer 320 and the first conductivity type doping layer 340 that are situated as being spaced apart from each other to form a bidirectional diode region. In an example, the second conductivity type body 330 receives the bias voltage $B_{IN}$ from the bias electrode 370 to generate the flow of the current toward the first conductivity type epitaxial layer 320 or the first conductivity type doping layer 340. Meanwhile, when the second conductivity type body 330 is implemented as the P type body and the first epitaxial layer 320 and the first conductivity type doping layer 340 are implemented as the N− epitaxial layer and an N+ doping layer, respectively, the bidirectional diode may be implemented as a PN junction diode, according to an example.

In the example of FIG. 3, the first conductivity type doping layer 340 is located on the top of the second conductivity type body 330 as having a predetermined depth. In such an example, the predetermined depth of the first conductivity type doping layer 340 corresponds to a depth sufficient for preventing the second conductivity type body 330 and the source electrode 370 from contacting each other. In the example of FIG. 3, the first conductivity type doping layer 340 is disposed on the bottom of the insulating layer 360 and the source electrode 370. In such an example, the first conductivity type doping layer 340 is injected with the high-concentration ions to be implemented as the N+ doping layer. In order to achieve the predetermined depth of the first doping layer 340, energy and dose amounts of the ion injection are controlled accordingly.

In an example, an etching process for a region of the first doping layer, which faces the source electrode 370, is omitted so as to form a predetermined depth between the second conductivity type body 330 and the source electrode 370. In further detail, the etching process for a region of the first conductivity type doping layer 340, which faces a second region 372 of the source electrode, is omitted to maintain the predetermined depth.

In another example, a part of a region of the first doping layer, which faces the source electrode 370 is etched so as to form the predetermined depth between the second conductivity type body 330 and the source electrode 370. That is, in such an example, a depth of a region of the first conductivity type doping layer 340, which faces the insulating layer 360 may be larger than the depth of the region of the first conductivity type doping layer 340, which faces the source electrode 370.

In an example, the first conductivity type doping layer 340 is not particularly limited to these specified characteristics, but is formed with a depth of 0.3 to 0.5 μm to prevent the source electrode 370 and the second conductivity type body 330 from contacting each other. In this example, the depth of 0.3 to 0.5 μm corresponds to a depth to prevent the body contact of the source electrode 370 while the first conductivity type doping layer 340 forms a diode region with the second conductivity type body 330. That is, the first conductivity type doping layer 340 is connected with the channel region formed in the second conductivity type body 330 to form a part of a bidirectional diode region.

In an example, the first conductivity type doping layer 340 is not particularly limited to the features presented above, but may have a threshold voltage of at least 12 V to prevent the source electrode 370 and the second conductivity type body 330 from contacting each other. Thus, the threshold voltage of 12 V corresponds to a voltage for the first doping layer 340 to form the diode region with the second conductivity type body 330. That is, the first conductivity type doping layer 340 is connected with the channel region formed in the second conductivity type body 330 to form a part of the bidirectional diode region.

In the example of FIG. 3, the gate electrode 350 vertically penetrates the second conductivity type body 330 and the first conductivity type doping layer 340. Furthermore, the gate electrode 350 is adjacent to the lower part of the insulating layer 360 and is covered with an insulating film 352 in other regions. The gate electrode 350 covered by the insulating film 352 is inserted into the first conductivity type epitaxial layer 320. The gate electrode 350 is spaced apart from the second conductivity type body 330 by the insulating film 352. That is, the gate electrode 350 and the second conductivity type body 330 are insulated from each other by the insulating film 352.

For example, the insulating layer 360 is located on the top of the first conductivity type epitaxial layer 320, the second conductivity type body 330, the first conductivity type doping layer 340, and the gate electrode 350. In an example, the insulating layer 360 is implemented through a metal oxide film technique and a part of the insulating layer 360 may be patterned. In further detail, the insulating layer 360 is formed on the top of the gate electrode 350 to cause the gate electrode 350 and the source electrode 370 to be spaced apart from each other. A region of the insulating layer 360, which does not face the gate electrode 350 disposed on the bottom of such a region, may be etched.

In the example of FIG. 3, the insulating layer 360 insulates the source electrode 370 and the gate electrode 350 and a region required for placing in contact the source electrode 370 and the first conductivity type doping layer 340 is etched. In further detail, in such an example, the top of the insulating layer 30 faces the first region 371 of the source electrode and the top of the first conductivity type doping layer 340 faces the second region 372 of the source electrode. That is, in such an example, the source electrode 370 penetrates the etched region of the insulating layer 360.

The source electrode 370 penetrates the insulating layer 360 in order to be connected with the first conductivity type doping layer 340. In the example of FIG. 3, the contact of the source electrode 370 with the second conductivity type body 330 is prevented by the presence of the first conductivity type doping layer 340. In further detail, the source electrode 370 includes the first region 371 facing the top of the insulating layer 360 and the second region 372 facing the top of the first conductivity type doping layer 340. In this example, the second region 372 of the source electrode is formed by the etched region of the insulating layer 360.

In the example of FIG. 3, the bias electrode 380 is situated to be spaced apart from the source electrode 370 and to contact the second conductivity type body 330 through the insulating layer 360. For example, the bias electrode 380 applies the bias voltage $B_{IN}$ to the second conductivity type body 330 to generate the flow of the current toward the first conductivity type epitaxial layer 320 or the first conductivity type doping layer 340.

Figure 4:
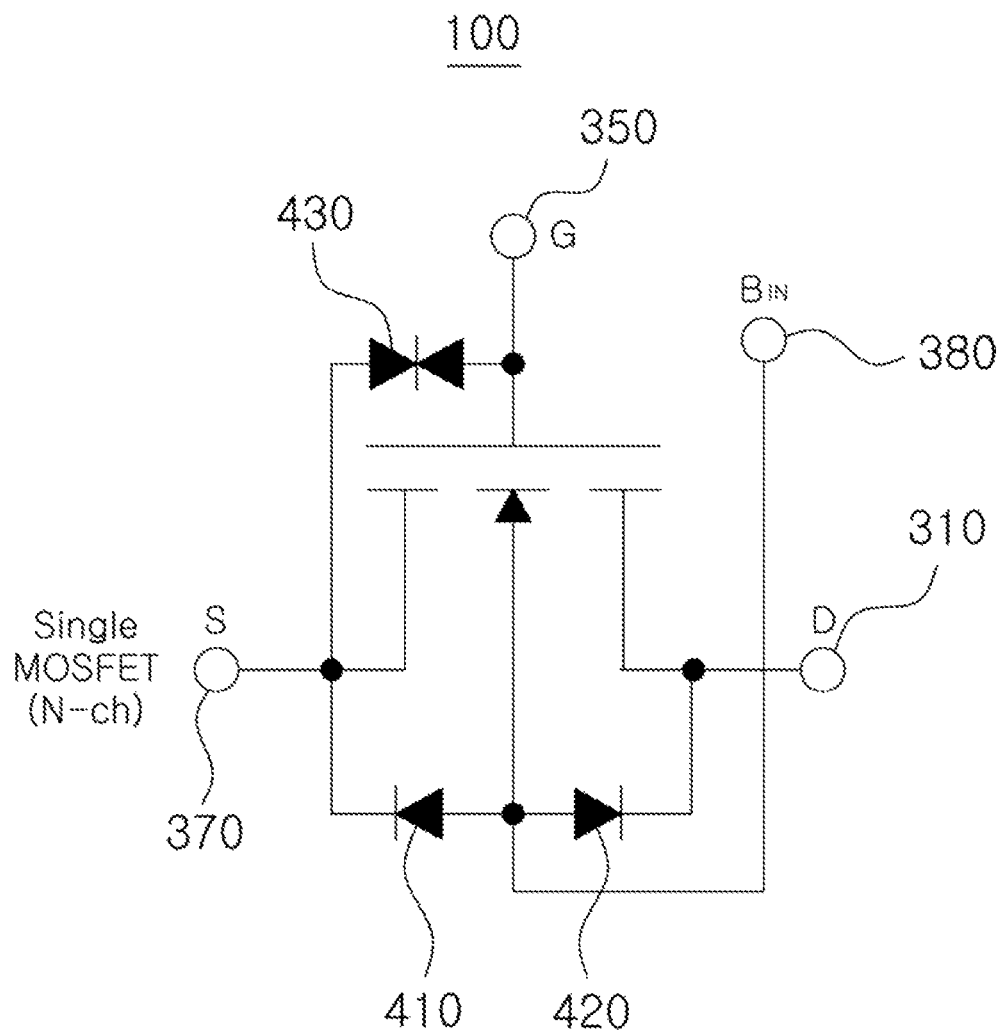
FIG. 4 is a circuit diagram describing the power MOSFET of the battery protection circuit in the example of FIG. 2.
Figure 5A:
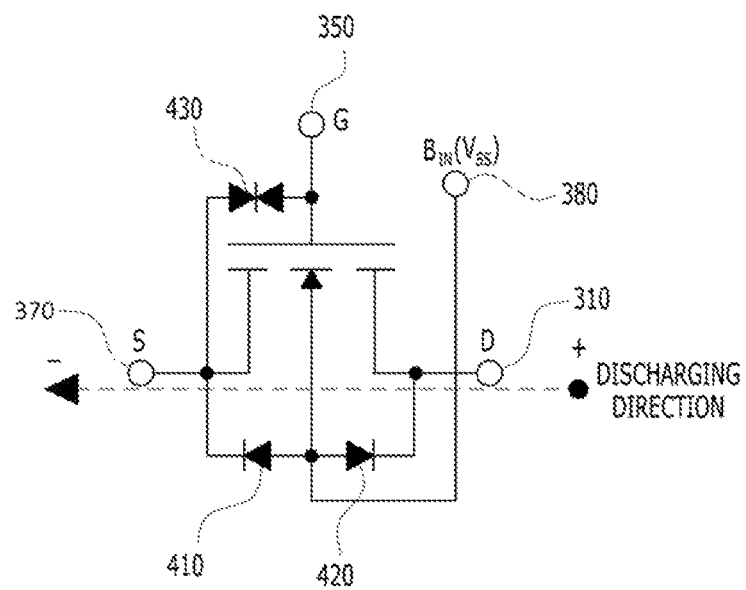
FIGS. 5A-5B are diagrams describing an operation of the power MOSFET of the battery protection circuit in the example of FIG. 2.
Figure 5B:
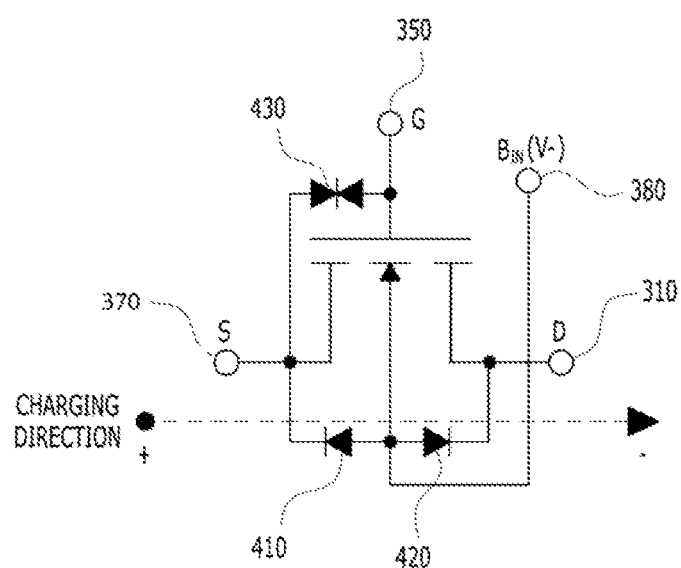

FIG. 4 is a circuit diagram describing the power MOSFET of the battery protection circuit in the example of FIG. 2 and FIGS. 5A-5B are diagrams describing an operation of the power MOSFET of the battery protection circuit in the example of FIG. 2.

Referring to the examples of FIGS. 4 and 5A-5B, the power MOSFET 100 includes first and second diodes 410 and 420 and a first overvoltage suppressing element 430. In the examples of FIGS. 4-5A-5B, the first and second diodes 410 and 420 are formed in the bidirectional diode formed in the power MOSFET 100. The first and second diodes 410 and 420 may be disposed in different directions in connection with the bias electrode 380. In an example, the first diode 410 is disposed to face the source electrode 370 and the second diode 420 is disposed to face the drain electrode 310.

In the example of FIG. 5A, the bias electrode 380 applies source voltage $V_{SS}$ to the second conductivity type body 330. Herein, the source voltage $V_{SS}$ corresponds to a voltage having an equivalent electrical potential to a voltage of the source electrode 370. When the bias electrode 380 applies the source voltage $V_{SS}$, the second conductivity type body 330 and the source electrode 370 have the equivalent electrical potentials, and as a result, the current may flow through the second diode 420. In an example, when the bias electrode 380 applies the source voltage $V_{SS}$, the second diode 420 operates to prevent the power MOSFET 100 from being overdischarged.

In the example of FIG. 5B, the bias electrode 380 applies a drain voltage V− to the second conductivity type body 330. In the example of FIG. 5B, the drain voltage V− corresponds to a voltage having an equivalent potential to a voltage of the drain electrode 310. When the bias electrode 380 applies the drain voltage V−, the second conductivity type body 330 and the drain electrode 310 have equivalent potentials, and as a result, the current is able to flow through the first diode 410. In an example, when the bias electrode 380 applies the drain voltage V−, the first diode 410 operates to prevent the power MOSFET 100 from being overcharged.

Accordingly, the power MOSFET 100 forms the bidirectional diode region controlled by the bias voltage $B_{IN}$ to perform the same function under a further improved condition than that provided by the plurality of protection elements 12. The power MOSFET 100 may perform the same functional performance as two protection elements 12 forming a unidirectional diode region, or an even further improved functional performance than two protection elements 12.

In the example of FIG. 5B, the first overvoltage suppressing element 430 is situated between the source electrode 370 and the gate electrode 310. In such an example, the first overvoltage suppressing element 430 prevents the overcurrent from flowing onto the power MOSFET 100 by applying the overvoltage in a managed way to the power MOSFET 100. In an example, the first overvoltage suppressing element 430 may be implemented as a transient voltage suppression (TVS) diode.

Figure 6A:
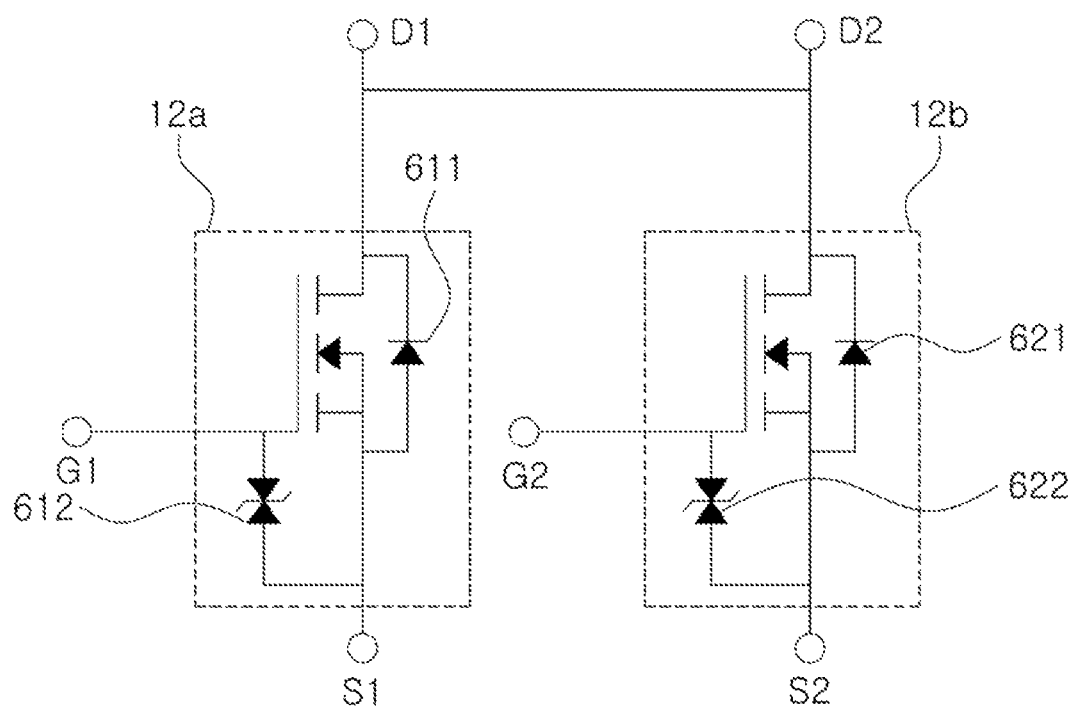
FIGS. 6A-6B are diagrams describing a plurality of protection elements of the battery protection circuit in the example of FIG. 2.
Figure 6B:
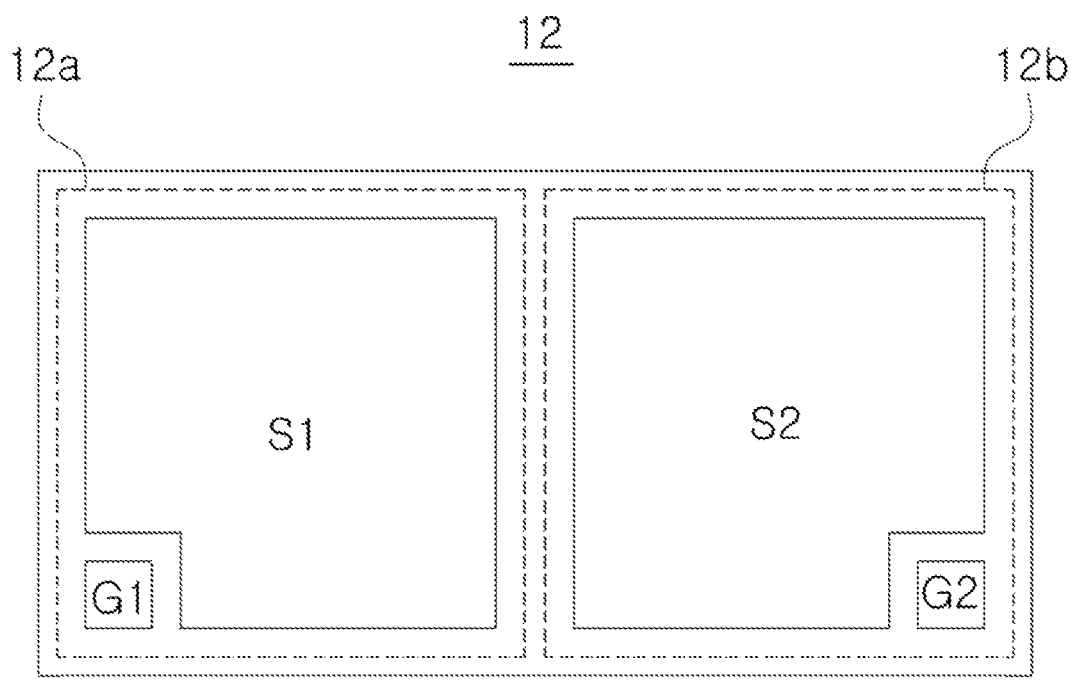

FIGS. 6A-6B are diagrams illustrating a plurality of protection elements of the battery protection circuit in the example of FIG. 2. In more detail, FIG. 6A is a circuit diagram illustrating a plurality of protection elements implemented as dual MOSFETs and FIG. 6B is a diagram illustrating a layout of the plurality of protection elements implemented as the dual MOSFETs.

In FIG. 6A, the plurality of protection elements 12 is implemented as the dual MOSFETs in the related art to include first and second protection elements 12a and 12b. In such an example, the first protection element 12a includes a unidirectional diode 611 facing the drain terminal and a second overvoltage suppressing element 612 and the second protection element 12b includes a unidirectional diode 621 facing the drain terminal and a third overvoltage suppressing element 622. Accordingly, the power MOSFET 100 according to the example is implemented as a single MOSFET to include a bidirectional diode and a first overvoltage suppressing element 430 and is potentially implemented with lower cost than the plurality of protection elements 12 implemented as the dual MOSFETs.

In FIG. 6B, chips for the first and second protection elements 12a and 12b may be produced as parts of one layout. Meanwhile, the power MOSFET 100 is implemented as the single MOSFET to form one layout and is implemented as having a smaller area than the plurality of protection elements 12 in which the dual MOSFETs form one layout. Accordingly, the power MOSFET 100 is implemented as having a smaller area and is accordingly manufactured with a lower cost.

Figure 7:
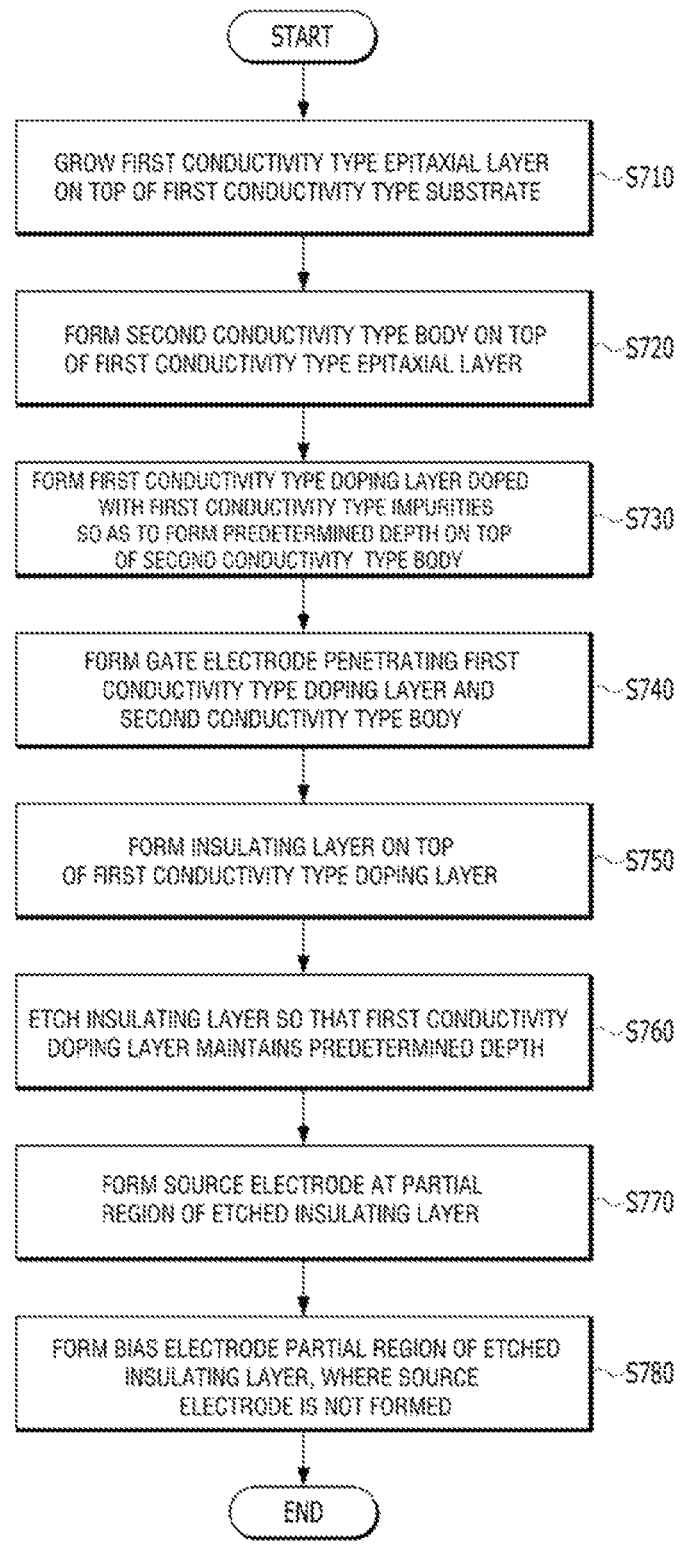
FIG. 7 is a flowchart describing a process of manufacturing the power MOSFET of the battery protection circuit in the example of FIG. 2.

FIG. 7 is a flowchart describing a process of manufacturing the power MOSFET of the battery protection circuit in the example of FIG. 2.

Referring to the example of FIG. 7, at step S710, the first conductivity type epitaxial layer 320 may be grown on the top of the first conductivity type substrate 310. The first conductivity type epitaxial layer 320 may be formed using the same crystal as the first conductivity type substrate 310. In an example, the first conductivity type substrate 310 is implemented as the N type substrate and the first conductivity type epitaxial layer 320 is implemented as the N− epitaxial layer.

In the example of FIG. 7, at step S720, the second conductivity type body 330 is formed on the top of the first conductivity type epitaxial layer 320 with a predetermined depth. In an example, the second conductivity type body 330 may be implemented as the P type body.

In this example, at step S730, the first conductivity type doping layer 340 is formed on the top of the second conductivity type body 330 with a predetermined depth. In an example, the first conductivity type doping layer 340 is injected with high-concentration N type impurities to be implemented as the N+ doping layer. In such an example, the predetermined depth corresponds to a sufficient depth in order to prevent the second conductivity type body 330 and the source electrode 370 from contacting each other.

In step S740, the gate electrode 350 vertically penetrates the first conductivity type doping layer 340 and the second conductivity type body 330. For example, the gate electrode 350 is adjacent to the lower part of the insulating layer 360 and is covered with the insulating film 352 in other regions.

In step S750, the insulating layer 360 is formed on the top of the first conductivity type doping layer 340. In various examples, the insulating layer 360 may be implemented through the Borophosilicate Glass (BPSG), Tetraethyl Orthosilicate (TEOS) or High temperature Low pressure Deposition (HLD) oxide layer and a part of the insulating layer 360 may be patterned.

In step S760, the insulating layer 360 is etched so that the first conductivity type doping layer 340 maintains the predetermined depth. The insulating layer 360 insulates the source electrode 370 and the gate electrode 350 and a region required for contacting the source electrode 370 and the first conductivity type doping layer 340 is etched.

In step S770, the source electrode 370 is formed on the top of a partial region of the insulating layer 360 which is etched. The source electrode 370 penetrates the insulating layer 360 to be connected with the first conductivity type doping layer 340 and the contact with the second conductivity type body may be prevented by the first conductivity type doping layer 340.

In step S780, the bias electrode 380 is formed at a partial region of the insulating layer 360, where the source electrode 370 is not formed. For example, the bias electrode 380 is situated to be spaced apart from the source electrode 370 and contact the second conductivity type body 330 by penetrating the insulating layer 360.

Figure 8:
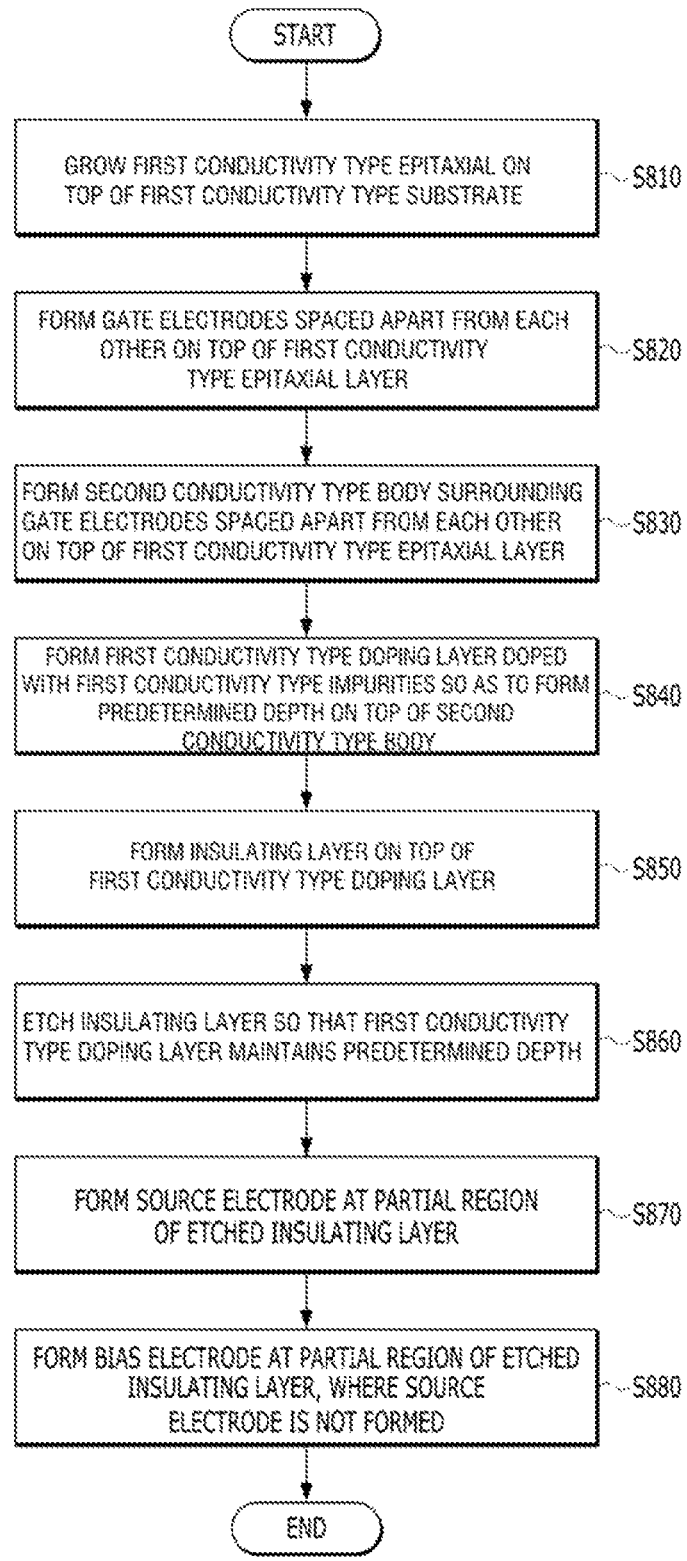
FIG. 8 is a flowchart describing a process of manufacturing the power MOSFET of the battery protection circuit according to another example.

FIG. 8 is a flowchart describing a process of manufacturing the power MOSFET of the battery protection circuit according to another example.

Referring to FIG. 8, at step S810, the first conductivity type epitaxial layer 320 may be grown on the top of the first conductivity type substrate 310. Then, at step S820, the gate electrodes 350 that are spaced apart from each other are formed on the top of the first conductivity type epitaxial layer 320.

In step S830, the second conductivity type body 330 is formed on the top of the first conductivity type epitaxial layer 320 with a predetermined depth so as to surround parts of the gate electrodes 350. Also, in step S840, the first conductivity type doping layer 340 is formed on the top of the second conductivity type body 330 with a predetermined depth.

Further, in step S850, the insulating layer 360 may be formed on the top of the first conductivity type doping layer 340. In step S860, the insulating layer 360 is etched so that the first conductivity type doping layer 340 maintains the predetermined depth.

At step S870, the source electrode 370 is formed on the top of a partial region of the insulating layer 360 which is etched. Finally, in step S880, the bias electrode 380 is formed at a partial region of the insulating layer 360, where the source electrode 370 is not formed.

Accordingly, the power MOSFET 100 controls the flow of the current through the first and second diodes 410 and 420. In an example of the power MOSFET 100, the etching process for a region of the first doping layer, which faces the source electrode 370, is omitted and the first conductivity type doping layer 340 forms a predetermined depth between the second conductivity type body 330 and the source electrode 370. That is, the power MOSFET 100 prevents the body contact of the source electrode 370 through the first doping layer 340.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power MOSFET comprising:
   an insulating layer;
   a first conductivity type doping layer situated on a bottom of the insulating layer;
   a second conductivity type body situated on a bottom of the first conductivity type doping layer;
   a gate electrode adjacent to the bottom of the insulating layer and covered with an insulating film in other regions and projected to penetrate the second conductivity type body; and
   a source electrode comprising a first region situated on a top of the insulating layer and a second region in contact with the first conductivity type doping layer by penetrating the insulating layer,
   wherein the insulating layer is in contact with the first conductivity type doping layer.

2. The power MOSFET of claim 1, further comprising:
a bias electrode situated to be spaced apart from the source electrode and to contact the second conductivity type body by penetrating the insulating layer.

3. The power MOSFET of claim 2, further comprising:
a first conductivity type epitaxial layer situated on a bottom of the second conductivity type body and inserted into by the gate electrode,
wherein the insulating layer is in contact with the second conductivity type body.

4. The power MOSFET of claim 3, further comprising a first conductivity type substrate, wherein the first conductivity type epitaxial layer is formed of the same crystalline material as the first conductivity substrate.

5. The power MOSFET of claim 3, wherein the second conductivity type body is connected with the first conductivity type epitaxial layer and the first conductivity type doping layer, situated to be spaced apart from each other to form a bidirectional diode region.

6. The power MOSFET of claim 5, wherein the bidirectional diode region is a PN junction diode.

7. The power MOSFET of claim 3, wherein the bias electrode applies bias voltage to the second conductivity type body to generate a flow of current toward the first conductivity type epitaxial layer or the first conductivity type doping layer.

8. The power MOSFET of claim 1, wherein the first conductivity type doping layer is formed by omitting an etching process for a region of the first conductivity type doping layer, which faces the source electrode so as to form the first conductivity type doping layer with a depth between the second conductivity type body and the source electrode.

9. The power MOSFET of claim 1, wherein the first conductivity type doping layer is formed by an etching process for a part of the region of the first conductivity type doping layer, which faces the source electrode so as to form a depth between the second conductivity type body and the source electrode.

10. The power MOSFET of claim 1, wherein the first conductivity type doping layer is formed with a depth being 0.3 to 0.5 μm and prevents the source electrode and the second conductivity type body from contacting each other.

11. The power MOSFET of claim 1, wherein the first conductivity type doping layer is formed with a threshold voltage of at least 12 V and prevents the source electrode and the second conductivity type body from contacting each other.

12. The power MOSFET of claim 1, wherein the insulating layer insulates the source electrode and the gate electrode from each other and a region of the insulating layer used for contacting the source electrode and the first conductivity type doping layer is etched.

13. A power MOSFET comprising:
an insulating layer;
a first conductivity type doping layer situated on a bottom of the insulating layer;
a second conductivity type body situated on a bottom of the first conductivity type doping layer;
a first conductivity type epitaxial layer situated on a bottom of the second conductivity type body;
a gate electrode adjacent to the bottom of the insulating layer and covered with an insulating film in other regions and projected to penetrate the second conductivity type body; and
a source electrode comprising a first region situated on a top of the insulating layer and a second region in contact with the first conductivity type doping layer by penetrating the insulating layer,
wherein the insulating layer is in contact with the first conductivity type epitaxial layer.

14. The power MOSFET of claim 13, wherein the insulating layer is in contact with the second conductivity type body.

15. A method for manufacturing a power MOSFET, the method comprising:
forming a first conductivity type doping layer doped with first conductivity type impurities at a depth on a top of a second conductivity type body situated on a top of a first conductivity type epitaxial layer;
forming a gate electrode penetrating the first conductivity type doping layer and the second conductivity type body;
forming an insulating layer on a top of the first conductivity type doping layer;
etching the insulating layer so that the first conductivity type doping layer maintains the depth; and
forming a source electrode at a partial region of the etched insulating layer,
wherein the insulating layer is directly in contact with the first conductivity type epitaxial layer, the second conductivity type body, and the first conductivity type doping layer.

16. The method of claim 15, wherein the depth corresponds to a sufficient depth to prevent the second conductivity type body and the source electrode from contacting each other.

17. The method of claim 15, wherein the etching of the insulating layer comprises etching the insulating layer to prevent the second conductivity type body and the source electrode from contacting each other.

18. The method of claim 15, wherein the etching of the insulating layer comprises etching the insulating layer so that the first doping layer is formed with the depth being 0.3 to 0.5 μm.

19. The method of claim 15, wherein the forming of the first conductivity type doping layer comprises doping the first conductivity type impurities so that the first conductivity type doping layer is formed with a threshold voltage of at least 12 V.

20. The method of claim 15, further comprising:
forming a bias electrode at a partial area of the etched insulating layer, where the source electrode is not formed.

21. The method of claim 20, wherein the forming of the bias electrode comprises applying a bias voltage to the second conductivity type body to generate a flow of current toward the first conductivity type epitaxial layer or the first conductivity type doping layer.

22. A method for manufacturing a power MOSFET, the method comprising:
forming gate electrodes spaced apart from each other on a top of a first conductivity type epitaxial layer;
forming a second conductivity type body surrounding the gate electrodes spaced apart from each other on the top of the first conductivity type epitaxial layer;
forming a first conductivity type doping layer doped with first conductivity type impurities at a depth on a top of the second conductivity type body;
forming an insulating layer on a top of the first conductivity type doping layer;
etching the insulating layer so that the first conductivity type doping layer maintains the depth; and forming a source electrode at a partial region of the etched insulating layer, wherein the insulating layer is directly in contact with the first conductivity type epitaxial layer, the second conductivity type body, and the first conductivity type doping layer.

23. The method of claim 22, wherein the etching of the insulating layer comprises etching the insulating layer to prevent the second conductivity type body and the source electrode from contacting each other.

24. The method of claim 22, wherein the etching of the insulating layer comprises etching the insulating layer so that the first doping layer is formed with the depth being 0.3 to 0.5 μm.

25. The method of claim 22, wherein the forming of the first conductivity type doping layer comprises doping the first conductivity type impurities so that the first conductivity type doping layer forms threshold voltage of at least 12 V.

* * * * *